(12) United States Patent
Luecken et al.

(10) Patent No.: US 8,334,512 B2
(45) Date of Patent: Dec. 18, 2012

(54) DETECTOR SYSTEM FOR USE WITH TRANSMISSION ELECTRON MICROSCOPE SPECTROSCOPY

(75) Inventors: Uwe Luecken, Eindhoven (DE); Frank Jeroen Pieter Schuurmans, Valkenswaard (NL); Cornelis Sander Kooijman, Veldhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 13/217,013

(22) Filed: Aug. 24, 2011

(65) Prior Publication Data

US 2012/0049060 A1 Mar. 1, 2012

Related U.S. Application Data

(60) Provisional application No. 61/376,973, filed on Aug. 25, 2010.

(30) Foreign Application Priority Data

Dec. 6, 2010 (EP) .................................... 10193806

(51) Int. Cl.
*H01J 47/00* (2006.01)
*G01N 23/00* (2006.01)
(52) U.S. Cl. ......... 250/311; 250/305; 250/306; 250/307
(58) Field of Classification Search .................. 250/305, 250/306, 307, 310, 311
See application file for complete search history.

(56) References Cited

U.S. PATENT DOCUMENTS

| | | | |
|---|---|---|---|
| 3,908,124 A * | 9/1975 | Rose | 250/311 |
| 5,097,126 A | 3/1992 | Krivanek | |
| 5,136,192 A | 8/1992 | Kooijman | |
| 5,393,976 A * | 2/1995 | Koike | 250/310 |
| 6,852,974 B2 * | 2/2005 | Kochi et al. | 250/311 |
| 6,933,500 B2 | 8/2005 | Kaji et al. | |
| 7,084,406 B2 * | 8/2006 | Knippelmeyer | 250/397 |
| 7,227,144 B2 * | 6/2007 | Tsuneta et al. | 250/311 |
| 7,372,029 B2 * | 5/2008 | Tsuneta et al. | 250/311 |
| 7,586,093 B2 * | 9/2009 | Feuerbaum | 250/311 |

(Continued)

FOREIGN PATENT DOCUMENTS

JP 2000113854 4/2000

OTHER PUBLICATIONS

Egerton, R. F., 'Electron Energy-Loss Spectroscopy in the TEM,' Rep. Prog. Phys., Dec. 16, 2008, 25 pgs, vol. 72.

(Continued)

*Primary Examiner* — Bernard E Souw
(74) *Attorney, Agent, or Firm* — Scheinberg & Associates, PC; Michael O. Scheinberg

(57) ABSTRACT

A detector system for a transmission electron microscope includes a first detector for recording a pattern and a second detector for recording a position of a feature of the pattern. The second detector is preferably a position sensitive detector that provides accurate, rapid position information that can be used as feedback to stabilize the position of the pattern on the first detector. In one embodiment, the first detector detects an electron energy loss electron spectrum, and the second detector, positioned behind the first detector and detecting electrons that pass through the first detector, detects the position of the zero-loss peak and adjusts the electron path to stabilize the position of the spectrum on the first detector.

16 Claims, 7 Drawing Sheets

U.S. PATENT DOCUMENTS

| | | | |
|---|---|---|---|
| 2004/0094712 A1* | 5/2004 | Kaji et al. | 250/310 |
| 2006/0151701 A1* | 7/2006 | Tsuneta et al. | 250/310 |
| 2011/0220793 A1* | 9/2011 | Thomas et al. | 250/307 |
| 2011/0266439 A1* | 11/2011 | Luecken et al. | 250/307 |
| 2011/0278451 A1* | 11/2011 | Tiemeijer et al. | 250/307 |
| 2012/0049061 A1* | 3/2012 | Luecken et al. | 250/307 |

OTHER PUBLICATIONS

Petersson, Goran, P., et al., 'Position Sensitive Light Detectors with High Linearity,' IEEE Journal of Solid-State Circuits, Jun. 1978, pp. 392-399, col. SC-13.

* cited by examiner

US 8,334,512 B2

DETECTOR SYSTEM FOR USE WITH TRANSMISSION ELECTRON MICROSCOPE SPECTROSCOPY

This application claims priority from U.S. Provisional Patent Application 61/376,973, filed Aug. 25, 2010, which is hereby incorporated by reference.

TECHNICAL FIELD OF THE INVENTION

The present invention relates to detectors for transmission electron microscopes.

BACKGROUND OF THE INVENTION

In a transmission electron microscope, a beam of high-energy electrons is directed toward a thin sample. Electrons in the beam interact with the sample as they pass through it and are collected below the sample. Some electrons pass through the sample relatively unhindered; others are deflected, absorbed, or lose energy. The electrons that pass through the sample carry information about the sample and produce a pattern on a detector. The pattern may correspond to, for example, an image of the sample, a diffraction pattern, or a spectrum of electron energy. Different imaging and analysis techniques use different characteristics of the transmitted electrons to form an image or to determine properties of the sample.

For example, information about the sample can be provided by measuring the energy absorbed as electrons pass though the sample. This technique is called "electron energy-loss spectroscopy" or EELS. An overview of EELS is provided by R. F. Egerton in "Electron energy-loss spectroscopy in the TEM," *Reports on Progress in Physics* 72 (December 2008). Different materials in the sample cause electrons to lose different amounts of energy as they pass through. The electrons pass through a spectrometer to determine the energy loss by subtracting their existing energy from the electron energy in the original electron beam. EELS can determine not only which elements are present, but also their chemical states.

An EELS spectrometer typically includes one or more prisms that separate electrons by their energies in an energy-dispersive plane by deflecting the electrons by an amount that depends on the electron energy. An energy dispersive plane is a plane in which electrons having different energies are dispersed in a direction normal to the direction of the beam travel. The term "prism" as used herein means any device that disperses the electron beam depending on the energies of electrons in the beam. A prism can provide, for example, a magnetic or electric field perpendicular to the beam. For example, a portion of a spherical capacitor, a magnetic deflector, or a Wien filter can be used as a prism. The angular dispersion of the electrons depends on the strength of the magnetic or electric field in the prism and the energy of the electrons. A prism may comprise multiple elements. Beside a prism, an EELS spectrometer may also include an adjustable energy-selecting slit, typically positioned in or near the energy-dispersive plane, and imaging optics that may include a system of prisms and/or lenses and/or multipoles or combinations thereof, to form an electron image on a detector that records the image. The detector can be, for example, a charged coupled device or active pixel sensor and may include a row or a two-dimensional array of pixels. Projection optics positioned after the sample and before the spectrometer project electrons into the entrance aperture of the spectrometer.

There are several mechanisms by which electrons lose energy as they pass through a sample. The different mechanisms cause electrons to lose different amounts of energy and account for the shape of a typical energy loss graph or spectrum. FIGS. 1A and 1B are spectra that show in arbitrary units numbers of electrons detected at various energy loss values. The energy loss spectrum varies with the material present in the sample and so information about the sample can be inferred from the spectrum.

FIG. 1A shows the so-called "low-loss" region 100 of the energy loss spectrum, which is defined somewhat arbitrarily as regions of less than 100 eV. Electron losses in the low-loss region result primarily from inelastic interactions, such as phonon interactions, plasmon interactions, collisions with outer shell electrons, non-ionizing collisions with inner shell electrons, and radiation losses. FIG. 1B shows a typical "core loss" region 108 of the spectrum. Electron losses in the core-loss region result from ionization of inner shell or "core" electrons and losses are typically greater than 100 eV. The spectra of FIG. 1A and FIG. 1B are not drawn to the same scale; the vertical scale of FIG. 1B is much enlarged compared to FIG. 1A.

FIG. 1A shows a large peak 102, called the "zero-loss peak," centered on zero energy loss. It is typically about 0.2 eV to 2 eV wide and represents primarily the energy spread in the original beam and small energy losses that occur in predominantly elastic collisions between the beam electrons and atomic nuclei. A broad plasmon peak 104 is caused by a resonance of the beam electrons with the valence electrons. FIG. 1B shows peaks 110, 112, and 114 having much higher energy losses that than those shown in FIG. 1A. Each peak is associated with the removal of a specific inner shell electron and the peak is characteristic of the specific sample material. The core loss spectrum provides information that readily identifies materials present in the sample, although information about the sample is also available from low-loss regions of the energy loss spectrum.

EELS can be performed on a conventional TEM or a Scanning Transmission Electron Microscope (STEM). Whereas in a TEM, the beam is focused by a condenser lens to a small area on the sample, in a STEM, the electron beam is focused to a point and the point is scanned, typically in a raster pattern, across the surface of the sample. FIG. 2A shows a TEM 200 that can perform EELS. Microscope 200 includes an electron source 210 and a focusing column including a condenser lens 212 that projects a beam 213 of primary electrons from source 210 onto a thin sample 214. The beam is composed of high energy electrons, that is, electrons having typical energies of between about 50 keV and 1,000 keV. Electrons that pass through sample 214 enter TEM imaging optics 216. TEM imaging optics 216 can be set to form a magnified image of the sample 214 at the entrance plane of a spectrometer 217, or to form a diffraction pattern at the entrance plane of the spectrometer 217. Electrons 204 pass through entrance aperture 215 and into spectrometer 217, which includes a prism 222 that disperses the electrons according to their energies into different trajectories 224a, 224b . . . 224d, etc.

Electrons are spread vertically according to their energies in an energy dispersive plane 225. A microscope that is capable of operating in the energy selected imaging mode includes an energy-selecting slit 226, having an upper knife edge 226U and a lower knife edge 226L, positioned at or near energy dispersive plane 225. The space between the knife edges is adjustable to pass electrons having energies within different ranges. Electrons 230 that pass through energy-selecting slit 226 are focused by imaging optics 232 onto a detector 234, such as a film, a fluorescence screen, a CCD detector, or an active pixel sensor. Electrons 236 having energies outside the specified range are blocked by energy-selecting slit 226. A spectrum 240 illustrates the quantity of electrons at various energy values, with most electrons being in the "zero-loss peak" 242.

FIG. 2B shows another TEM 248 that can perform EELS. Microscope 248 includes a spectrometer 250 configured as an "in-column" spectrometer, as opposed to spectrometer 217 of FIG. 2A, which is configured as a "post column" spectrometer. In an "in-column" spectrometer, electrons leave the spectrometer parallel to the direction at which the electrons entered. Spectrometer 250 includes for a prism an "omega filter" that typically includes at least four elements 252A, 252B, 252C and 252D. Elements 252A and 252B offset the electron path and disperse the electron beam. Elements 252C and 252D further disperse the electron beam and displace the beam back to the original optical axis. The symmetry between the first half of the omega filter consisting of elements 252A and 252B and the second half of the omega filter consisting of elements 252C and 252D are configured to cause several aberrations of the prisms to cancel. The dispersive actions of these two halves of the omega filter do not cancel and create an energy dispersive plane 254 after element 252D. In this plane, energy-selecting slits 256L and 256R are positioned. Electrons 260 that exit element 252D are focused by imaging optics 232 onto a detector 234.

TEMs commonly use charged-couple device ("CCD") detectors, which are damaged by high energy electrons. To prevent damage to the CCD detector, TEM detectors include a scintillator that converts the electrons to light, which is then detected by the CCD. The intervening scintillator reduces resolution of the detector. CMOS active pixel sensors (APS), particularly monolithic active pixel sensors (MAPS) were proposed and demonstrated as charged particle detectors for transmission electron microscopy. CMOS MAPS can be used as direct detectors, that is, the electrons impinge directly onto the semiconductor detector, without an intervening scintillator. To reduce backscattering of electrons within in the sensor substrate, which degrades resolution, CMOS MAPS are typically made very thin so that most of the electrons exit the backside of the detector.

As materials science advances, the composition of engineered materials requires tighter control, and it becomes more important to accurately determine the characteristics of the materials. Thus there is a constant demand to improve the resolution of TEM analysis methods, such as EELS, to better characterize materials.

SUMMARY OF THE INVENTION

An object of the invention is to improve the performance of transmission electron microscopes.

In accordance with the invention, a second detector is used to determine the position of an electron pattern that is detected by a primary detector. In some embodiments, electrons pass through the primary detector and are detected by a second detector behind the primary detector. The position of the electron pattern on the first detector is determined from the position of the electrons in the second detector. The second detector provides rapid, accurate information about changes in position of the pattern. Information from the second detector is used to maintain a constant position of the pattern, such as an EELS spectrum, on the primary detector.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Figure 1A:
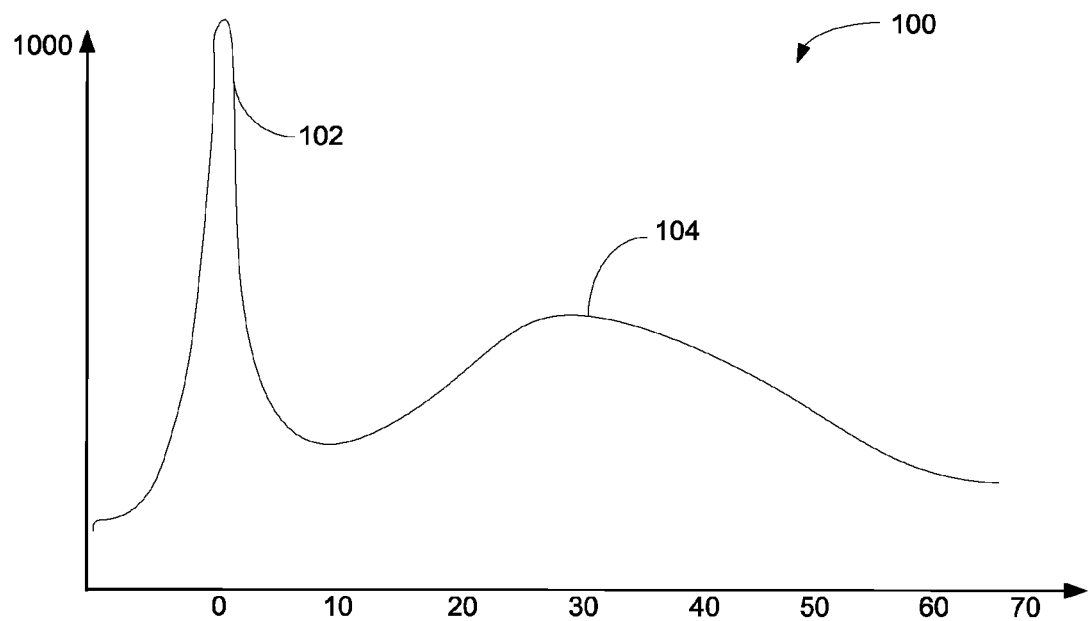
FIG. 1A shows an arbitrary electron energy loss spectrum in the low-loss region of the energy spectrum.
Figure 1B:
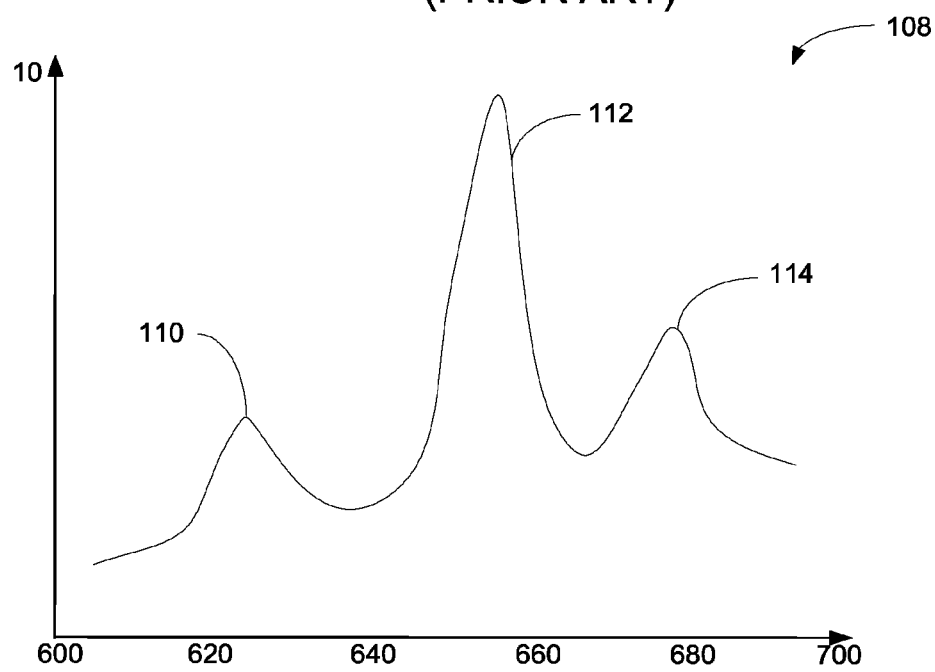
FIG. 1B shows an arbitrary electron energy loss spectrum in a core-loss region of the energy spectrum.

In transmission electron microscopy, electrons that pass through the sample carry information about the sample and produce a pattern on a primary camera detector. The pattern may correspond to, for example, an image of the sample, a diffraction pattern, or an energy loss spectrum. The position of the pattern on the detector is subject to constant small shifts, from a variety of causes. Temperature changes and mechanical vibration may cause small changes in the position of components in the electron beam column, which can shift the electron pattern on the detector. Also, electrical instabilities in the primary electron column can cause the energy of electrons in the primary beam to vary, which changes the electron position in the detector. When electrons are measured in a spectrometer for EELS, electrical and mechanical drift in the spectrometer can also contribute to changes in the spectrum position. The instability in position of the spectrum affects the resolution of the microscope. For example, instability spreads the peaks in the energy spectrum, making the peak location less precise.

In accordance with a preferred embodiment of the invention, a position sensor detects electrons and provides fast feedback to adjust the position of the pattern on the primary detector to maintain a stable, constant position. In some preferred embodiments, a real time position sensitive detector (PSD) is positioned behind the primary detector and detects electrons that pass through the thin primary detector. In other embodiments, the PSD may be positioned next to the primary detector. In some preferred embodiments, the pattern on the primary detector is an electron energy spectrum and the PSD detects the average position of electrons in the zero-loss peak that pass through the primary detector. The feedback from the PSD is used to maintain a relatively constant position of the zero-loss peak on the primary detector.

The signal from the PSD is used to generate a compensating signal that is applied to one or more elements of the microscope system to maintain a constant position of the zero-loss peak. For example, the accelerating voltage of the primary beam column may be adjusted or an electric or magnetic field in the spectrometer may be adjusted to return the peak to its previous position. Embodiments of the invention provide high resolution, real time feedback of the position of the zero-loss peak or other electron feature. Whereas the primary detector forms a two-dimensional image and therefore requires a two-dimensional pixel array, which must be read out to record the image, the PSD preferably does not form an image, and only detects a center of gravity of the electron distribution. The PSD can therefore be designed to provide higher resolution and faster read out than the primary detector. While the primary detector typically has a resolution of 10 μm to 20 μm, the PSD preferably has a resolution better than about 1 μm, and preferably operates at a speed of preferably 100 kHz or faster. The PSD need only detect a small portion of the pattern on the primary detector to determine changes in the pattern position and so can be much small than the primary detector. For example, the zero-loss peak can be held stationary on one location of the PSD, effectively stabilizing the position of the entire spectrum on the primary detector. In some applications, the PSD need only supply information about the position in one direction, such as the direction in which an EELS spectrum is spread. Fluctuations that cause a loss in the energy resolution on the camera detector can now be compensated real time, regardless of the source of the fluctuations.

Figure 2A:
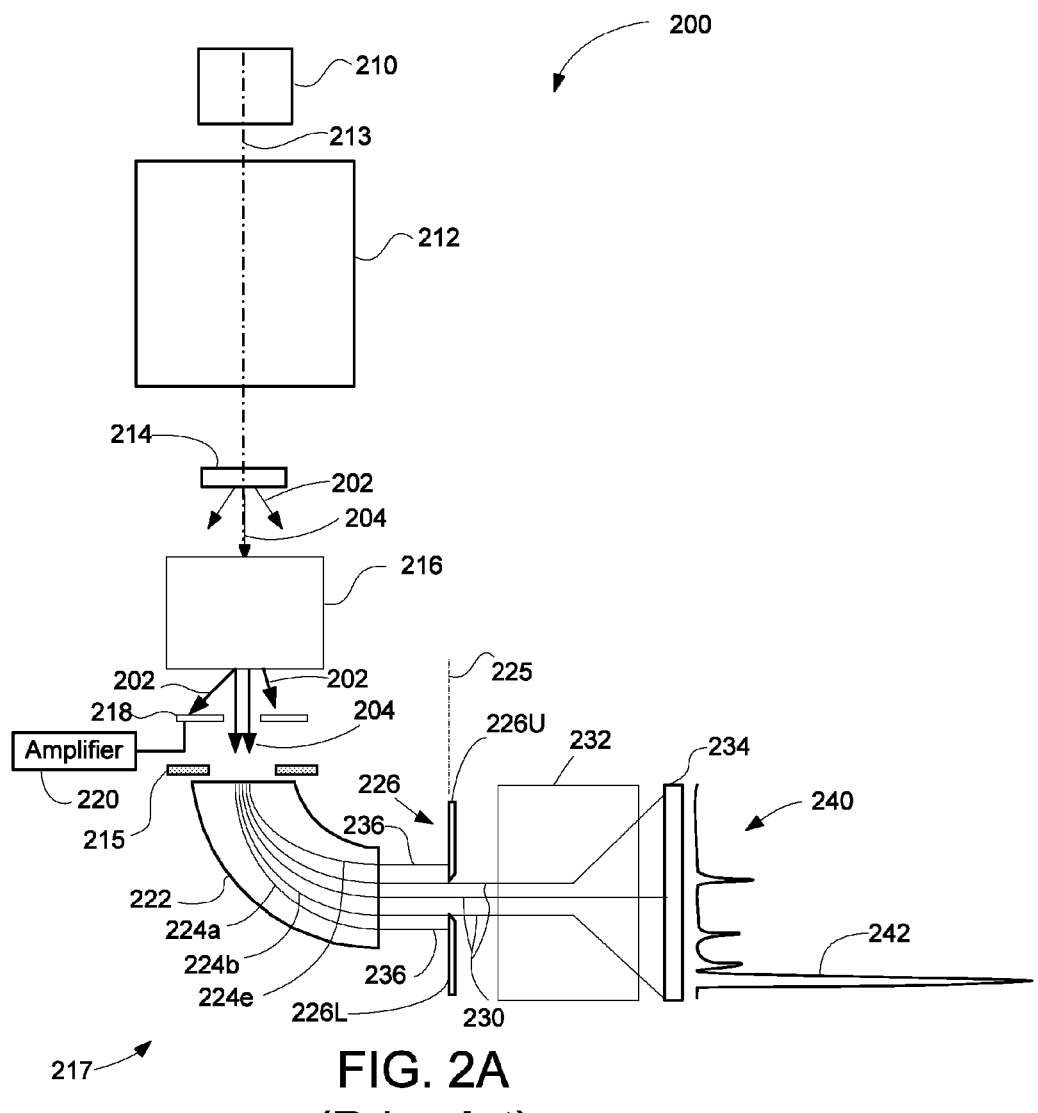
FIG. 2A shows a scanning transmission electron microscope having an EELS spectrometer.
Figure 2B:
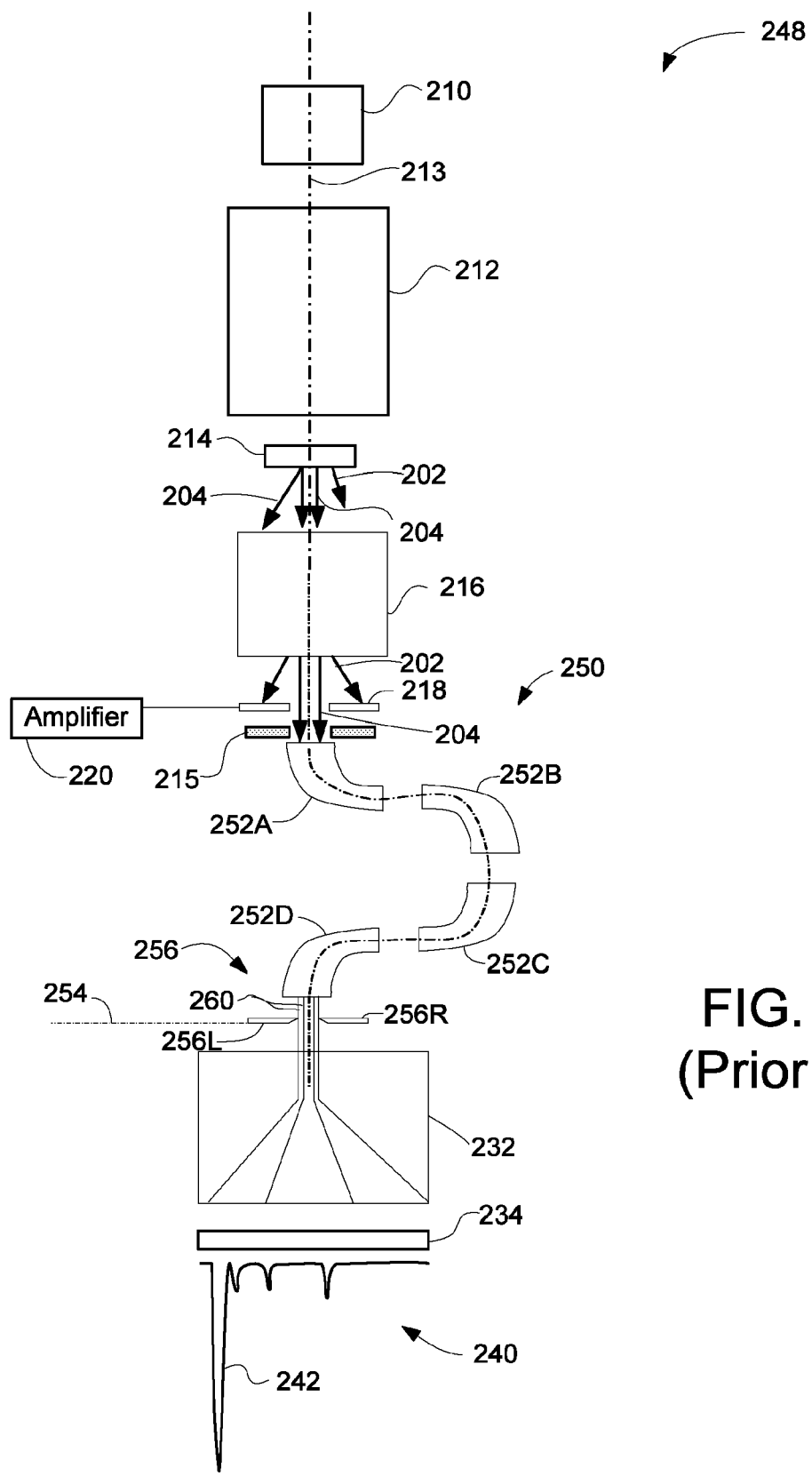
FIG. 2B shows another scanning transmission electron microscope having an EELS spectrometer.
Figure 3:
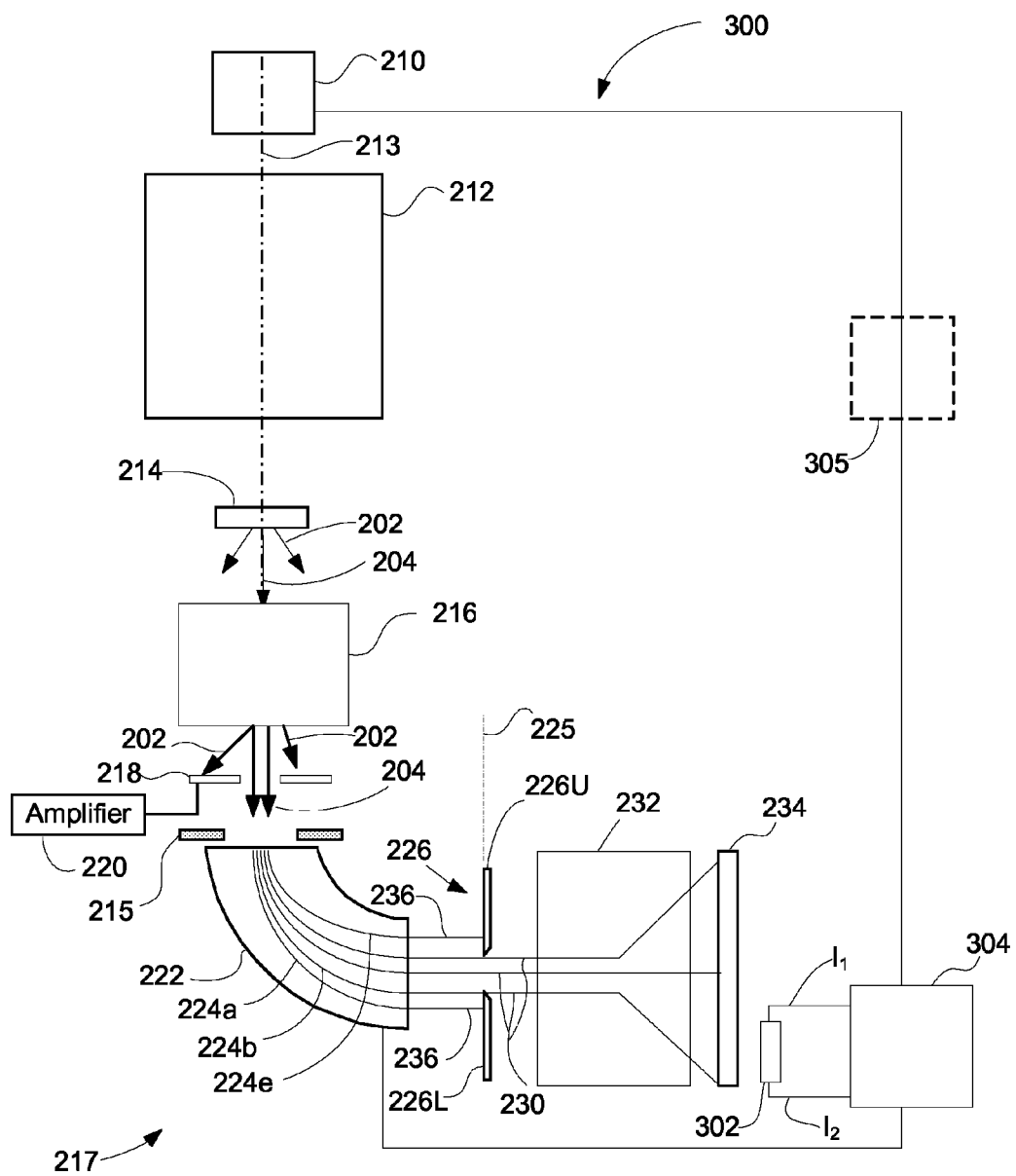
FIG. 3 shows a scanning transmission electron microscope embodying the present invention.
Figure 4:
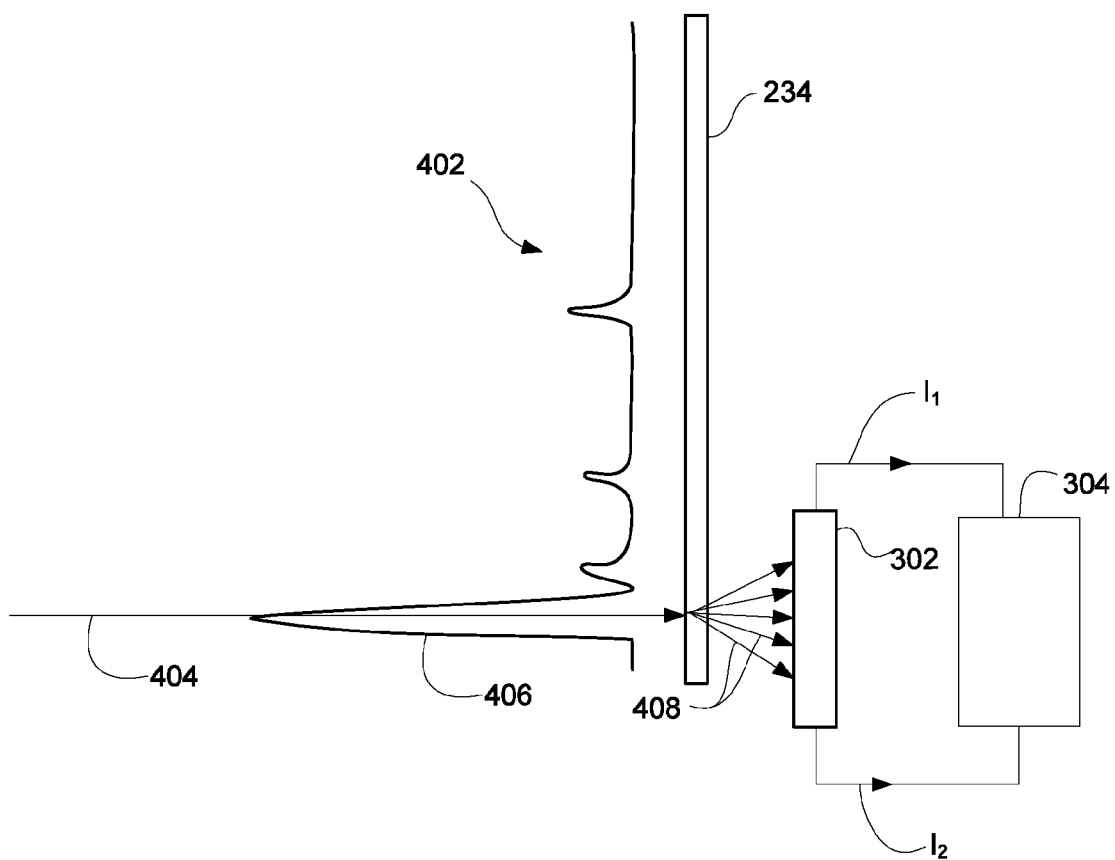
FIG. 4 shows an enlarged view of a portion of the electron microscope of FIG. 3.

FIG. 3 shows a portion of a TEM embodying the invention. The TEM 300 of FIG. 3 is similar to that of FIG. 2A, with the addition of second detector 302 behind detector 234. FIG. 4 shows an enlarged view of the region around detector 234 and detector 302, with an electron energy spectrum 402 shown before detector 234. Electrons 230 that have passed through sample 214 are dispersed according to their energies by a prism 222 and are spread onto detector 234 by imaging optics 232. Spectrum 402 shows (not to scale) the relative number of electrons at different positions along the vertical axis of detector 234. Electrons 404 passed through sample 214 with little or no loss of energy, and comprise the "zero-loss peak" 406 of spectrum 402.

Because detector 234 is very thin, typically less than 35 microns thick and preferably less than about 25 μm thick, many electrons 404 striking detector 234 will pass through the detector 234, being scattered somewhat during the process. Trajectories 408 are examples of paths of scattered electrons passing through detector 234. The percentage of electrons passing through detector 234 will depend on the energy of the electrons impinging on detector 234 and the thickness and composition of detector 234. In some embodiments, the energy of electrons is between around 200 keV and 400 keV, the detector is between 15 μm and 35 μm thick, and more than eighty percent of the electrons pass though the detector.

Detector 302 provides information about the location of the zero-loss peak 406. To maintain a relatively constant position of the spectrum 402 on detector 302 (and therefore on detector 234), the output of detector 302 is fed into circuit 304, which uses the output of detector 302 to provide a control signal as necessary to adjust the position of the zero-loss peak to maintain a constant position. The adjustment to the position of the zero-loss peak can be performed using any element in the microscope that influences the position of the zero-loss peak. For example, the adjustment could be to the accelerating voltage applied to electron source 210, to the current in dispersive element 222, or to the voltage in the drift tube. Adjusting some elements may produce unwanted consequences, such as altering the beam focus, and the element to be adjusted is chosen to avoid such consequences.

Circuit 304 may an analog circuit, a digital circuit, such as a microprocessor, microcontroller, or logic array, or some combination of analog and digital circuits. Circuit 304 may process the signal in an analog domain and provide an analog output to the microscope, or the signal from detector 302 may be converted to a digital signal and processed by circuit 304 in the digital domain to determine a desired output signal to adjust the microscope. The signal applied to the microscope is a function of the change in position of the zero-loss peak or other feature and may be determined from the output of sensor 302 using an algorithm, a look-up table, or any other means.

Because the purpose of detector 302 is to detect changes in position of the spectrum, it can be designed to provide very fast and accurate feedback. In a preferred embodiment, it does not need to provide information about the shape of the spectrum or about the absolute position of a peak of the spectrum. A preferred PSD does not require multiple pixels capable of forming an image. A preferred PSD supplies signals corresponding to the center of gravity of the electron distribution on the detector. By "center of gravity" of the electron distribution is meant the arithmetic average of the locations at which electron energy is deposited onto the detector.

One type of PSD comprises of a monolithic PIN semiconductor photodiode with a uniform resistance in one or two dimensions. When an electron impinges on the diode, electron-hole pairs are created. Currents flow toward contacts at opposite ends of the detector, with the currents being inversely proportional to the distance between the respective contact and the electron impingement location. The current is highly linear. PSDs are commercially available, for example, Hamamatsu Corporation, Bridgewater, N.J.

The output of the PSD is preferably highly linear with respect to the position of the center of gravity of the incoming electron distribution. To produce output that varies linearly with position, the entire feature being detected, such as the zero-loss peak, should impinge on the PSD. That is, the feature should not shift off of the detector while it is being used to stabilize the pattern. The zero-loss peak is typically very narrow, between about 0.2 eV and about 2 eV, and the width of the zero-loss peak on the detector 234 is typically less than 10 μm. The scattering of the electrons within the primary camera detector 234 will increase the size of the zero-loss peak when it reaches the PSD. Because detector 402 merely determines the center of gravity of the impinging electrons, spreading of the peak has little or no effect on the accuracy of the position measurement. As the distance between the primary detector and the PSD increases, the scattering increases. The PSD is typically mounted about 2 mm behind the primary detector. The size of the PSD is preferably longer than 100 μm to capture the scattered electrons from the zero-loss peak. Because the initial position of the zero loss peak on the detector may not be precisely known, particularly when the instrument is first turned on, the PSD should be sufficiently large enough to capture the entire zero-loss peak within its likely range of positions. A preferred PSD is therefore between about 1 mm and about 30 mm.

Some PSDs are analog devices whose accuracy is inversely proportional to their length. The positional measurement accuracy of a monolithic photodiode PSD is typically about 0.001 of its length, but a resolution of 0.0001 of length has been demonstrated. A one millimeter PSD can have a resolution of 1 μm or better. A 10 mm PSD can provide a resolution of 10 μm or better. Resolution can be improved by reducing the bandwidth of the feedback loop to filter out noise, bringing the resolution of a 10 mm detector down to 5 μm or even 2 μm, although slowing the readout. The preferred PSD will vary with the application, and skilled persons can optimize the size, resolution, and speed for specific applications. The PSD is preferably smaller than the primary detector, preferably less than about ½, less than about ¼, or less than about $1/10^{th}$ the length of the corresponding dimension in the primary detector. In one embodiment, detector 234 is about 60 mm long and detector 402 is about one or two millimeters long.

Figure 5:
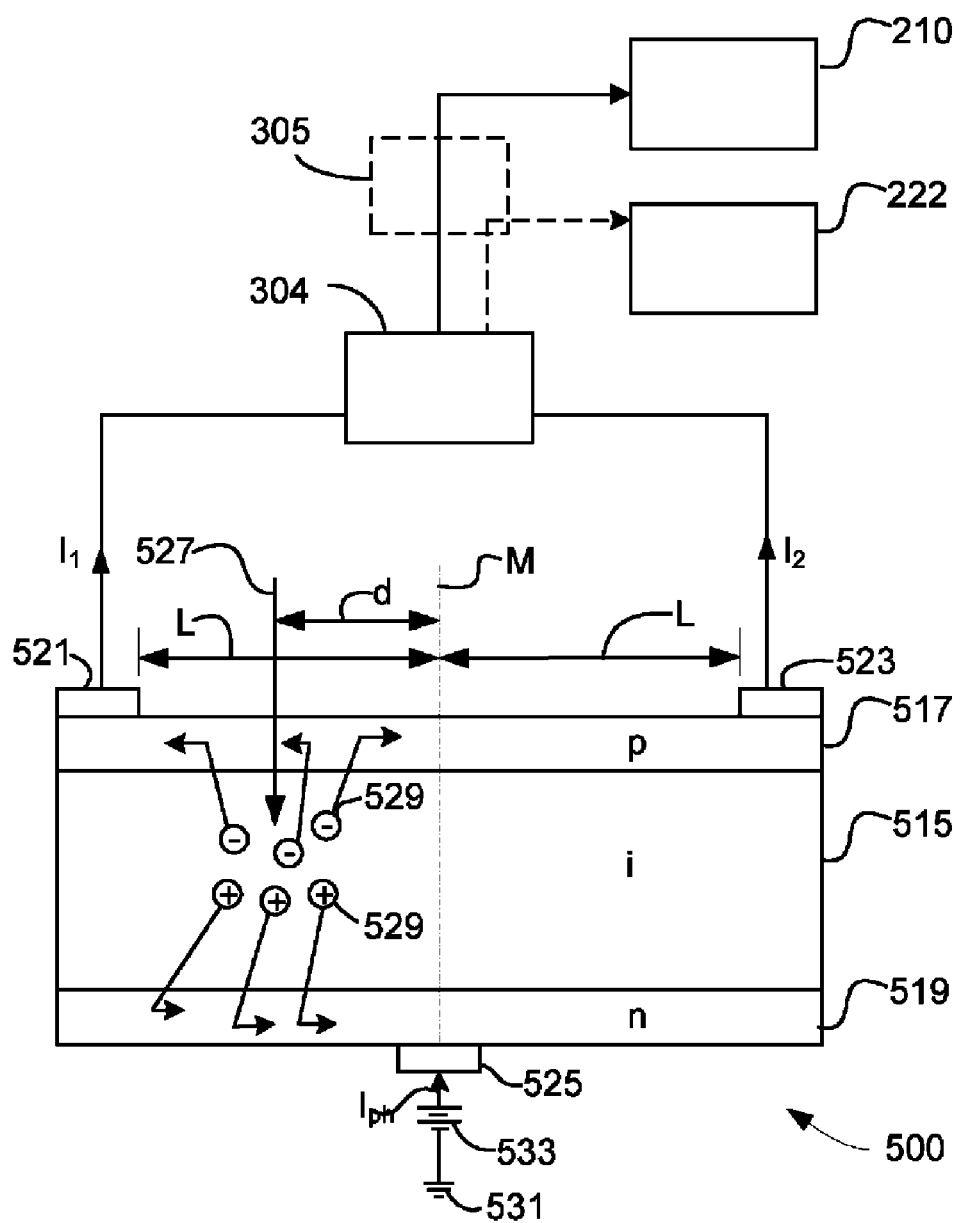
FIG. 5 shows a position sensitive detector that can be used with the present invention.

A PSD is described in U.S. Pat. No. 5,136,192, which is hereby incorporated by reference, and is shown in FIG. 5. The PSD 500 consists of a plate 515 of pure silicon that has a thickness of approximately 0.25 mm and on one side of which it is provided with a p-layer 517, an n-layer 519 being provided on the opposite side, resulting in a p-i-n structure. At the side of the p-layer the PSD is provided with two measuring contacts 521 and 523 in order to obtain a position-dependent signal. The n-layer is provided with a single power supply contact 525. Also known are PSDs comprising two or more contacts on one or on both sides. For example, see IEEE Journal of Solid-State Circuits, Vol. SC-13, No. 3, pp. 392-399. It is to be noted that the dimensions in the vertical direction are greatly exaggerated in FIG. 5.

When an electron 527 is incident on a point between the two measuring contact 521 and 523 pairs of charge carriers 529 are generated, which charge carriers reach the measuring contacts 521, 523 and the power supply contact 525 via the p-layer and the n-layer, respectively. When a voltage source 533 of correct polarity is connected between the power supply contact 525 and a reference point 531, the generated charge carriers 529 cause a photocurrent $I_{ph}$ from the positive pole of the voltage source 533 to the power supply contact 525. This photocurrent is distributed between the measuring contacts 521 and 523, causing currents $I_1$ and $I_2$, respectively, for which $I_1+I_2=I_{ph}$. The value of the measuring currents $I_1$ and $I_2$ depends on the location in which the electron 527 is incident on the layer 517. The measuring contacts 521 and 523 are situated at a distance L from the center "M" of the PSD 500 and the electron 527 is incident on the layer 517 at a distance "d" from the center M, where d may vary from +L (the electron is incident on the PSD near the left hand measuring contact 521) to −L (the light beam is incident on the PSD near the right hand measuring contact 523). The measuring currents $I_1$ and $I_2$ are equal to:

$$I_1 = I_{ph}(1+d/l)/2; \text{ and}$$

$$I_2 = I_{ph}(1+d/l)/2$$

Defining d/L as X, the expression:

$$X = \frac{I_1 - I_2}{I_1 + I_2}$$

is obtained by dividing the equations for $I_1$ and $I_2$ by their sum. X represents the distance of the center of gravity of impinging electrons from the center M of the detector. A preferred PSD is highly linear, that is, the current $I_1$ and $I_2$ depend in a linear fashion on the distance at which the electrons impinge from the ends of the sensors.

Calculation can be performed rapidly in circuit 304 in the analog domain or the current can be converted to voltages, digitized, and the processing can be performed in the digital domain. Changes in X indicate that the position of the center of gravity electron distribution has shifted and a circuit 304 determines based on the change in X an adjustment to be made to the system to move the position of the center of gravity electron distribution back to its original position. Circuit 304 can provide analog feedback to an element of the column or can provide digital feedback. The adjustment may comprise, for example, changing the accelerating voltage of the primary beam or adjusting the electric field in the spectrometer 217.

Another type of PSDs is a dual photocell, also called a "duocell," that has two photodiodes with a thin boundary between them. The zero-loss peak can be centered on the barrier between the two photodiodes, so that the currents in the two photodiodes are equal. The beam position is adjusted to maintain the balance between the two currents. A quadrant photocell cell can similarly used.

Figure 6:
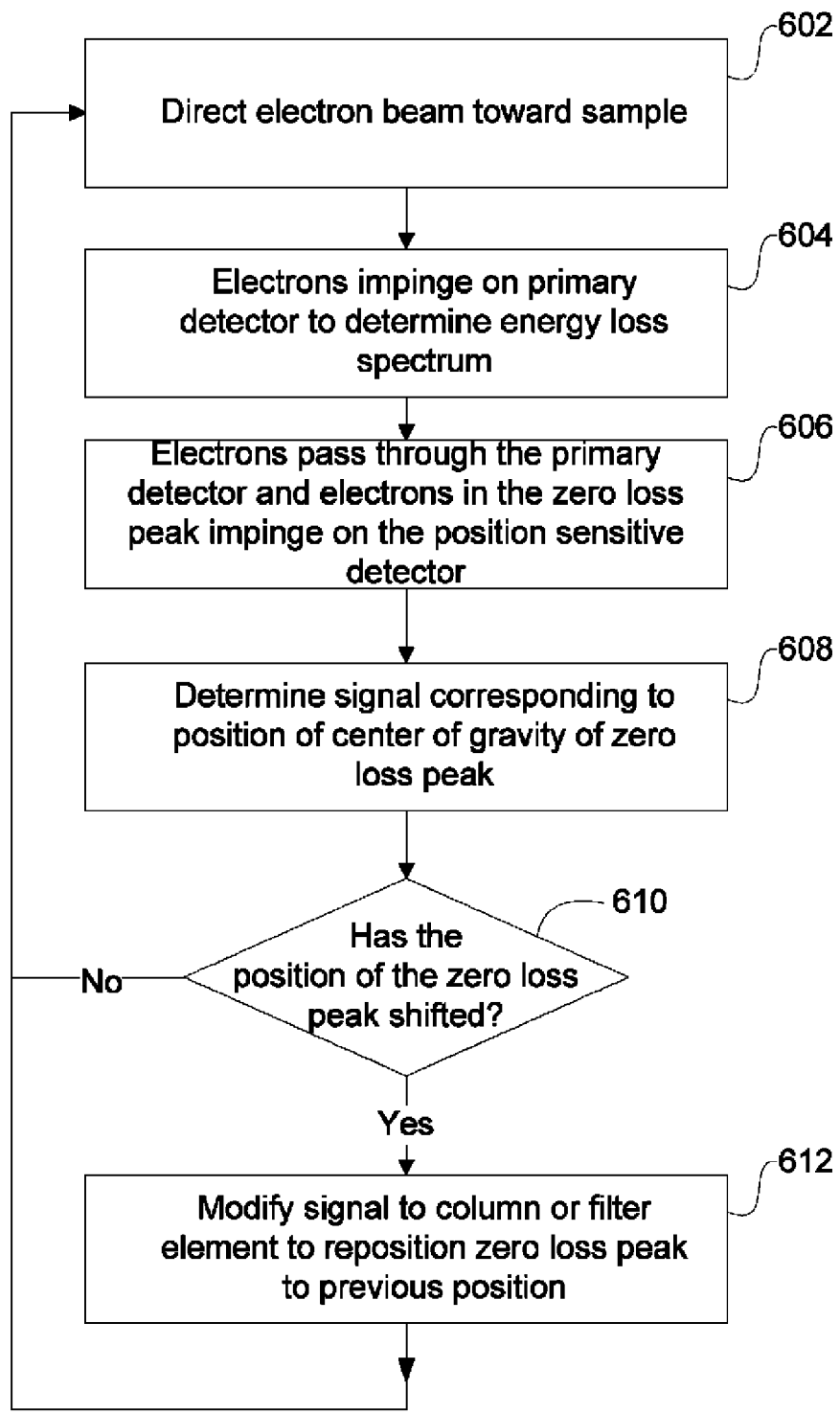
FIG. 6 is a flow chart showing steps of a preferred embodiment of the present invention.

FIG. 6 is a flow chart showing a preferred method of the present invention. In step 602, an electron beam is directed toward a sample. In step 604, electrons impinge on a thin spectrum detector to determine the energy loss spectrum for the sample. In step 606, electrons that pass through the thin spectrum detector impinge on the PSD. In step 608, a value of the center of gravity of the zero-loss peak is determined from the PSD. In step 610, the system determines whether the position of the center of gravity of the zero-loss peak has shifted since the last measurement. In step 612, a signal is applied to an element of the electron beam column to adjust the position of the zero-loss peak. FIG. 6 shows that the steps 602 to 610 repeat. The process is preferably continuous, with the electron beam being directed toward the sample, and the spectrum detector accumulating data as more electron pass through the sample. While FIG. 6 shows discreet steps, it will be understood that in some embodiments, the steps are occurring simultaneously, with the feedback being continuous to maintain the position of the zero-loss peak.

While the embodiment described above is used with an EELS spectrometer, the invention can be used to stabilize the position of any detector pattern, such as a diffraction pattern or an image, on an electron detector by detecting a portion of the pattern, such as a dot on a diffraction pattern or a spot on an image, on a PSD.

Some electrons may be back scattered from detector 302 into detector 234 and cause erroneous readings. Backscattering is reduced by making detector 302 small. Backscatter may also be reduced by increasing the distance between detector 302 and detector 234, although increasing the distance also spreads the signal at detector 302 from the zero-loss peak and requires a larger detector 302. One can empirically determine an optimum distance that reduces backscatter while providing sufficient positional accuracy. Because the size and position of the detector 302 is fixed, the backscattering can be determined and the image from detector 234 can modified to compensate for the backscattering. In another embodiment, a plastic detector can be used for detector 302, which greatly reduce backscatter.

While a preferred embodiment uses a PSD behind a thin primary detector, in some embodiments, the PSD could be positioned adjacent the primary detector, that is, above or below the primary detector. A deflector could be used to displace the spectrum to the PSD periodically for measurements, and then shift the spectrum back to the primary detector, corrected for any shift. Also, the PSD could detect a feature that is positioned off the primary detector. For example, a zero loss peak could be detected on a PSD while a core-loss spectrum is detected on a primary detector located on the same plane as the PSD.

While a one dimensional PSD was described in the embodiment above, a two-dimensional PSD, such as a quadrant detector or a monolithic PIN diode with contacts on four sides, could be used to detect a portion of a pattern in two dimensions to stabilize a pattern on a primary detector in two dimensions.

The "zero-loss peak" refers to electrons that have passed through the sample with little or no energy loss. Such electrons will lose energy passing through the first detector and the term does not apply to energy lost or not lost in passing through the first detector. The term "positional information" means, as opposed to image information, information about the relative position of the center of gravity of an incoming electron distribution, as opposed to information from a two-dimensional pixel array that provides information about the number of electrons impacting within each pixel.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. An electron detection system for a transmission electron microscope, comprising:
   a first sensor for detecting a pattern of electrons that have passed through a sample;
   a second sensor for detecting the position of the pattern of electrons, the second detector providing feedback to adjust the position of the pattern on the first detector.

2. The electron detection system of claim 1 in which the second sensor has greater positional resolution than the first sensor and in which the second sensor provides faster readout of position that the first sensor.

3. The electron detection system of claim 1 in which the second sensor provides positional information and not image information.

4. The electron detection system of claim 1 in which the second sensor comprises a monolithic PIN sensor or a dual photocell.

5. The electron detection system of claim 1 in which the second sensor is positioned behind and detects electrons that exit the rear face of the first sensor.

6. The electron detection system of claim 1 in which the electron detection system is an electron energy spectrometer, and further comprising a dispersive element for separating according to their energies electrons that have passed through a sample.

7. The electron detection system claim 1 in which the first sensor is a CMOS sensor.

8. The electron detection system of claim 1 in which the second sensor detects a zero-loss peak signal from the sample that passes through the first sensor.

9. The electron detection system of claim 1 in which the thickness of the first sensor is less than 35 μm.

10. A transmission electron microscope, comprising:
    a electron column for generating electrons, directing the electrons towards a sample and projecting electrons that pass through the sample toward a detector;
    an electron detection system in accordance with claim 1;
    means for using information from the second sensor to adjust the electron column to stabilize the position of a pattern on the first sensor using positional information from the second sensor.

11. The transmission electron microscope of claim 10 in which the electron column includes an electron spectrometer and in which using information from the second sensor to adjust the electron column to stabilize the position of a pattern on the first sensor includes using the position of a zero-loss peak on the second sensor to stabilize the position of an electron energy loss spectrum on the first sensor.

12. The method of claim 11 in which adjusting the electron column to stabilize the position of a pattern includes adjusting an element of the spectrometer.

13. A method of operating a transmission electron microscope, comprising:
    directing a beam of electrons towards a sample;
    detecting a pattern of electrons that have passed through the sample using a first sensor;
    detecting the position of a portion of the electrons that pass through the sample using a second sensor;
    adjusting the position of the pattern of electrons on the first sensor using positional information from the second sensor.

14. The method of claim 13 in which:
    detecting a pattern of electrons that have passed through the sample using a first sensor includes detecting an energy loss spectrum;
    detecting the position of a portion of the electrons that pass through the sample using a second sensor including detecting the position of a zero loss peak using a second sensor positioned behind the first sensor and detecting electrons that have passed though the first sensor; and
    adjusting the position of the pattern of electrons on the first sensor including adjusting the electron accelerating voltage or adjusting the spectrometer.

15. The method of claim 13 in which the first sensor comprises a two-dimensional pixel array and in which the second sensor provides positional information, the second sensor providing higher resolution positional information that is available from the first sensor and the second sensor capable of supplying the positional information is less time than the first sensor could provide positional information.

16. The electron detection system of claim 1 in which
    the first sensor is sufficiently thin so that a significant proportion of electrons entering a front face of the sensor exit the first sensor through a rear face of the sensor; and
    the second sensor is positioned behind the first sensor and detects electrons exiting the first sensor through a rear face of the sensor and provides an electronic signal representing the position on the first sensor of electrons having a specified energy.

* * * * *